United States Patent [19]

Zasio

[11] Patent Number: 4,587,480
[45] Date of Patent: May 6, 1986

[54] DELAY TESTING METHOD FOR CMOS LSI AND VLSI INTEGRATED CIRCUITS

[75] Inventor: John J. Zasio, Sunnyvale, Calif.

[73] Assignee: Storage Technology Partners, Louisville, Colo.

[21] Appl. No.: 622,428

[22] Filed: Jun. 20, 1984

Related U.S. Application Data

[62] Division of Ser. No. 389,573, Jun. 17, 1982, Pat. No. 4,495,628.

[51] Int. Cl.⁴ ............................................. G01R 15/12
[52] U.S. Cl. ................................................ 324/73 R
[58] Field of Search ............ 324/73 R, 73 AT, 73 PC

[56] References Cited

U.S. PATENT DOCUMENTS 4,146,835 3/1979 Chnapko et al. .................. 324/73 R
4,357,703 11/1982 Van Brunt .......................... 324/73 R

*Primary Examiner*—Gerard R. Strecker
*Assistant Examiner*—Walter E. Snow

*Attorney, Agent, or Firm*—Bryant R. Gold; James R. Young

[57] ABSTRACT

A CMOS LSI or VLSI integrated circuit chip includes a shift register circuit that provides internal delay testing capability. The shift register circuit is disposed around the periphery of the chip and includes a large number of serially connected stages. One mode of operation allows a data signal to pass through the shift register circuit at a speed limited only by the propagation delays associated with the individual stages thereof. In this mode of operation, one net inversion is introduced into the data path and the output of a final stage of the shift register circuit is coupled to the input of a first stage of the shift register circuit, thereby creating a ring oscillator. The period of oscillation of this ring oscillator represents a measure of the average propagation delay times associated with the various circuit elements employed within the LSI or VLSI circuitry. Such delay measurements can readily be made at any level of packaging or system operation.

3 Claims, 8 Drawing Figures

DELAY TESTING METHOD FOR CMOS LSI AND VLSI INTEGRATED CIRCUITS

This application is a division of application Ser. No. 389,573, filed 06/17/82, now U.S. Pat. No. 4,495,628.

BACKGROUND OF THE INVENTION

This invention relates to large scale integration (LSI) circuit chips and very large scale integration (VLSI) circuit chips, and more particularly to LSI and VLSI circuit chips using complementary metal oxide semiconductor (CMOS) logic circuitry. Still more particularly, the present invention relates to CMOS LSI and VLSI circuit chips including a special set of integral test circuitry which, in addition to being used to functionally test the chip, is used to test the electrical delay of the circuits on the chip prior to packaging in an integrated circuit package.

Integrated circuit chips are formed on a wafer. A wafer is a thin slice of pure silicon, typically four inches in diameter for LSI and VLSI circuits, on which an array of chips are fabricated. The wafer is scribed, and along the unused channels between the chips, and the chips are broken off from the wafer. They are then packaged in an integrated circuit package for testing and, if they pass testing, for use.

The percentage of properly operating chips on a wafer, i.e., the yield, is often very low. In LSI and VLSI technology, the yield can be as low as 10 percent because of the complexities involved in the fabrication process. Since the packaging of a chip adds considerably to its manufacturing cost, it is desirable to fully test chips when they are still part of the wafer to avoid the expense of packaging defective chips.

There are typically three types of tests that are required to fully test an integrated circuit: (1) functional tests show whether all the circuits function as requried; (2) parametric tests show that the input and output circuits of the chip have the correct electrical characteristics; and (3) delay tests show that the circuits perform with the necessary speed. This invention provides a means of easily performing the third test while the CMOS LSI or VLSI chip is still part of the wafer.

Delay testing of CMOS LSI or VLSI chips has not heretofore been possible for the reasons set forth below. However, it will be helpful to understand the advantages of the present invention to review the evolution of delay testing as it relates to non-LSI or -VLSI integrated circuit technology.

Testing chips when they are part of the wafer requires a method of getting signals into, and reading signals from, the chip's input/output (I/O) pads. Probe mechanisms have been developed to satisfy this need. A probe is a mechanical arm, electrically conductive, with a fine point on one end to make electrical contact with an I/O pad; the other end of the probe being wired to the tester electronics. Probe systems have been fabricated that have as many probes as the number of I/O pads on the chip being tested. The contact ends of the probes are arranged in the same pattern as the I/O pads such that when the chip is aligned under the probes, an electrical signal from the tester causes the probe points to lower and make contact with the I/O pads.

When contact is made with all the I/O pads, test patterns can be applied to the input pads and a clock signal, if necessary, is generated by the tester and sent to the appropriate input pad. The response of the circuitry on the chip to the input signals can then be read by the tester through the probes connected to the output pads. The tester can compare the output pattern read from the chip to the pattern that is expected, based upon the input pattern, and determine if the chip is functioning correctly. Thus, the probe system satisfies the functional test requirement of testing chips while still part of the wafer.

The probe system is also used for delay measurements by the use of special test chips. These test chips are placed at strategic locations with the array of desired functional chips, thereby using up space on the wafer that could otherhwise be used for additional functional chips. The test chips have a small number of I/O pads and the delay test is performed using a probe mechanism that is different from that used for functional test of the other chips. Because of the small number of I/O pads on the test chip, the probe arms on the delay tester can be made very small. Therefore, the inductance of the probe arms does not affect the delay test results. Since each test chip displaces a potentially usable functional chip, only a small number of test chips are used on each wafer.

The results of delay testing test chips (which results may vary by as much as 25 percent) can be used to eject an entire wafer. However, even if the delay test results do not cause wafer rejection, all the functional chips that passed functional test must still be delay tested after being individually packaged. As explained below, as the density of integrated circuit technology increased, the use of these test chips became impractical.

In the early 1970's, wafers were typically 2-inches in diameter and the line widths (the minimum dimension) on a chip were typically 7-microns. The mask (a different mask is required for each step in the wafer fabrication process) was typically 1:1 size and was used to expose the resist on the wafer using a contact printing process. The mask was generated using a reticle, which was the pattern for one layer of one chip. The original layout was made using manual or automated techniques and was usually much larger than actual size; typically 100:1 to 500:1. This was reduced, using photographic reduction methods, to the reticle which was typically a 10:1 size. The reticle was then inserted into a step-and-repeat camera which reduced it to a 1:1 size, as it exposed the pattern on the mask. The mask locations that were to have the test chip pattern were skipped. When all of the chip patterns were exposed on the mask, the test chip reticle was inserted in the step-and-repeat camera and the camera exposed the test chip pattern in the blank locations.

By the mid-1970's, wafers were typically 3-inches in diameter and line widths on a chip were typically 4-microns. The mask was generated at a 1:1 size, including the test chips, by electron-beam systems, and exposed on the wafer by a 1:1 projection alignment system.

By 1980, wafers were typically 4-inches in diameter and line widths on a chip were typically 2-microns. The projection alignment system was no longer adequate for the accuracy required. Because of the small dimensions involved, reticles were generated at 10:1 size using an electron beam system. Masks were not used; rather the reticle was exposed on the wafer resist using a direct step on wafer (DSW) system. The DSW system did not allow the replacement of the chip reticle with a test chip reticle because of the very fine tolerances involved in making the exposure. Thus, by the time VLSI technology had emerged, test chips were no longer practical.

Performing delay tests on a normal chip in LSI and VLSI technology has not heretofore been practical for two major reasons: (1) circuit delays decreased; and (2) the number of I/O pads increased as LSI and VLSI technology developed.

The decrease in circuit delays means that the time between the application of the input pulses and the detection of the output pulse becomes smaller, dictating a more precise measurement of the time involved if the answers are to be meaningful. As the circuit density of the chip and the number of I/O pads increased, the size of the chip did not increase in the same proportion. In fact, as the number of I/O pads on a chip increased, they had to be made smaller and closer together.

The end of the probe arm which is wired to the tester is much wider than the contact end. Therefore, the row of probe arms along each side of a chip form a "fan", narrow at the probe end and wide at the end wired to the tester. Since a chip is typically square, with I/O pads and probe arms along each side, as the number of I/O pads increased, the length of the probe arm has to increase because the four "fans" get wider at the tester end of the probe arm. This increased probe length adds significant inductance to the test circuits used for delay testing.

As mentioned above, the decreased circuit delays inherent to LSI and VLSI technology require more precise measurement when performing delay tests. This means that the rise and fall times of the signals generated and measured must be small compared to the delay being measured. Further, the switching point of the output signal, with respect to the switching point of the input signal, must be measured more accurately. However, the inductance of the longer probe distorts the signals used for the delay test, lengthening the otherwise fast rise or fall times. Thus, even though a delay can be measured, the time between the switchings of the first input circuit and last output circuit can not be determined with enough accuracy to make a go/no-go decision. Therefore, LSI and VLSI chips, while still part of the wafer, are functionally tested, but accurate delay testing must still be done after the chip is packaged in an integrated circuit package.

SUMMARY OF THE INVENTION

The present invention addresses the problem of how to delay test CMOS LSI and VLSI chips while they are still part of the wafer. By so doing, the expense of packaging chips which may not meet the delay requirements is avoided. The invention accomplishes this solution by taking advantage of two characteristics of CMOS technology explained in the following two paragraphs.

The CMOS LSI and VLSI circuit technology is inherently intolerant of process defects, while quite tolerant of process variations. Because of the fine geometries involved, a defect, such as a mask with too poor line resolution or a pin-hole in the resist, usually results in a catastrophic failure. That is, the circuit fabricated with the defect typically will not function and is detected at functional test when the chip is still part of the wafer. Process variations such as doping level, temperature, diffusion time, etc., usually yield circuits that will function but may be too slow for the intended use. Functional test, being a steady state test, typically will not detect delay faults caused by process variations.

Another characteristic of CMOS LSI and VLSI circuit technology is that if process variations affect circuit delays, then over a single chip on a wafer, all circuits will be affected in approximately the same way. Therefore, if a single meaningful delay measurement can be made on a CMOS LSI or VLSI chip, while it is still part of the wafer, a high confidence level decision may be made about the delays of all the circuits on that chip. The present invention allows such a delay test to be made.

The present objective of the invention is accomplished by using a CMOS LSI or VLSI integrated circuit having integral test circuitry consisting of a shift register around the periphery of the chip. The shift register has a stage, or storage location, physically corresponding to each of the I/O pads of the chip. The shift register is normally used by the tester to functionally test the chip. This method of testing is discussed in applicant's copending patent application, Ser. No. 332,866, filed Dec. 21, 1981.

Additional circuitry is used to gate a signal from the tester, with one inversion, into the shift register. All stages of the shift register are held open so that the signal passes through the shift register and appears at the output. When the shift register is used in this manner, it is called a ring oscillator. Each stage of the ring oscillator causes a double inversion of the signal so the signal that appears at the output, because of the single inversion of the additional circuitry, is the inversion of what the tester originally sent. The additional circuitry gates this output signal back to the tester for detection, as well as to the inverter to circulate through the ring oscillator again. The transit time of the signal through all the stages of the ring oscillator is a measure of the delay of the circuits on the chip.

BRIEF DESCRIPTION OF THE DRAWINGS

The above and other features, advantages, and objects of the present invention will be better understood by the following more detailed description of the invention presented in conjunction with the accompanying drawings, in which.

DETAILED DESCRIPTION

The following description is of the best presently contemplated mode of carrying out the invention. The description is made for the purpose of describing the general principles of the invention and is not to be taken in a limiting sense. The scope of the invention is best defined by the appended claims.

Figure 1:
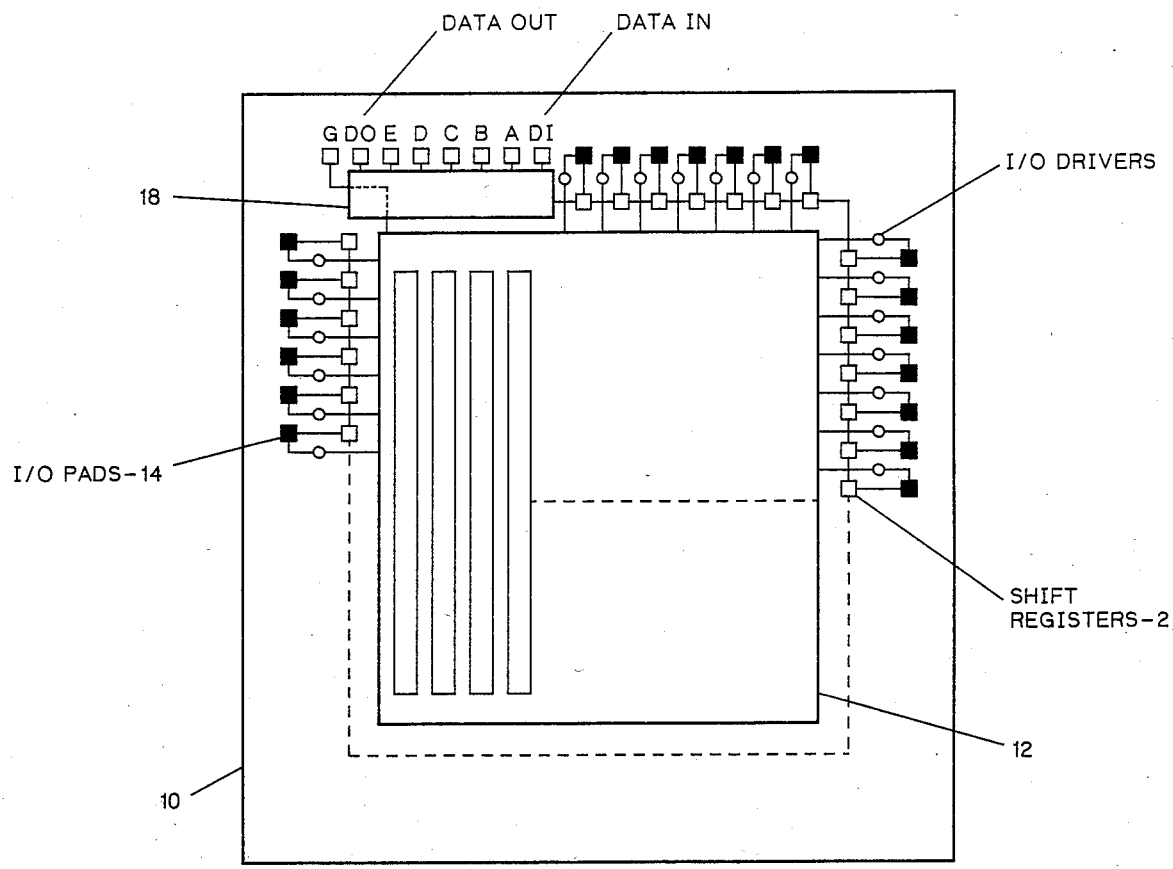
FIG. 1 is a diagrammatic top plan view of the chip of the present invention.

Referring to FIG. 1, the present invention is part of an integrated circuit 10 which includes internal circuitry 12 connected to a number of I/O pads 14 by means of I/O drivers 16. The integrated circuit of the present embodiment uses CMOS VLSI and has two hundred and fifty-six I/O pads 14. Seven of the I/O pads 14, labeled DI, A, B, C, D, E and DO are connected to the tester input/output control and clock control circuitry 18. A shift register 20, with a stage connected to each pad 14 (with the exception of the test pads mentioned above and the pads dedicated to ground and power supply connections) is formed around the perimeter of the chip 10. The shift register is normally used for functionally testing the chip as described in applicants copending patent application, Ser. No. 332,866, filed Dec. 21, 1981. However, in the present invention the shift register is used as a ring oscillator when performing delay measurements. These operations are all controlled by the input/output control and clock control circuitry 18.

Figure 2:
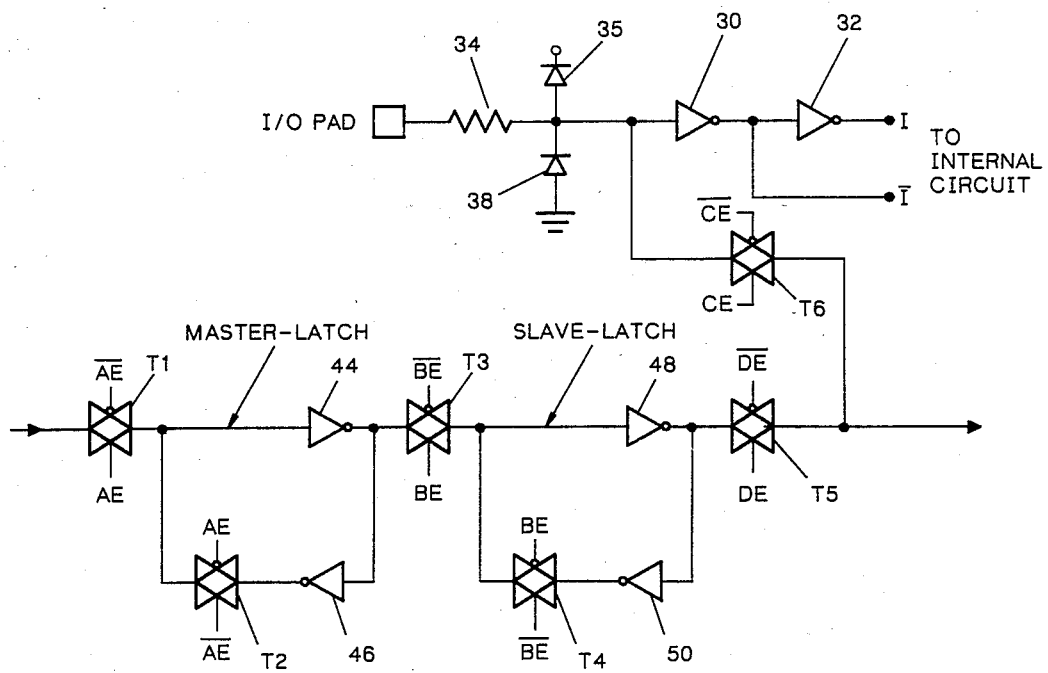
FIG. 2 is a schematic diagram of an input pad and associated latch.
Figure 3:
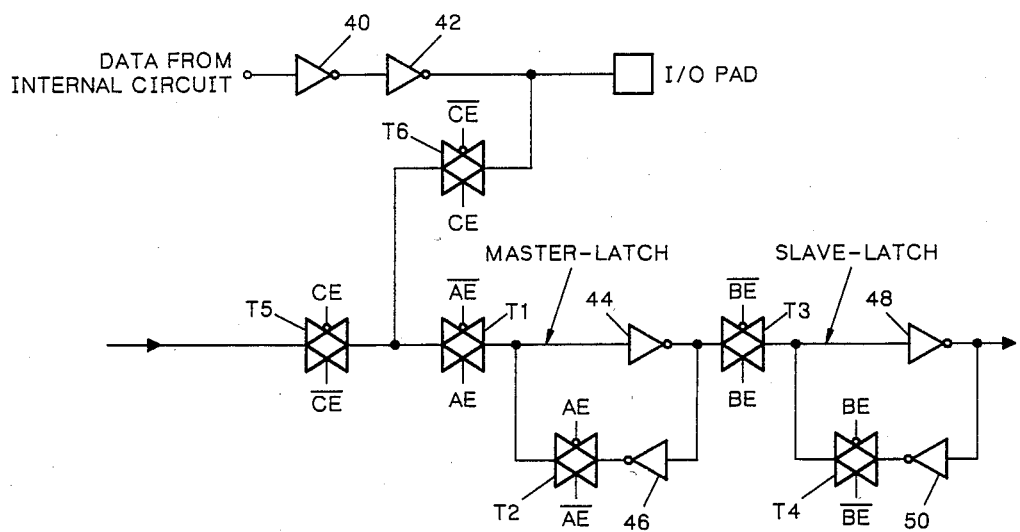
FIG. 3 is a schematic diagram of an output pad and associated latch.

FIGS. 2 and 3 each show a shift register stage and I/O circuitry for an individual pad. FIG. 2 shows a shift register stage when it is associated with an input pad while FIG. 3 shows the configuration when the shift register stage is associated with an output pad. Each shift register stage includes four inverters, 44–50, and six transmission gates T1-T6. In the present embodiment, the shift register is used as a ring oscillator. In this application the transmission gates T1, T3 and T5 are turned on by control signals. This allows a signal that is input at the first stage of the ring oscillator to be propagated to the output of the last stage. Each stage has two inverters so the output of the ring oscillator is the same polarity as the input. The signal goes through five circuit delays at each stage of the ring oscillator; that is, each of the three transmission gates and the two inverters each have one circuit delay associated there with.

Figure 4:
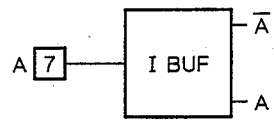
FIG. 4 is a block diagram showing the provision of complementary inputs to the clock control circuitry.
Figure 4:
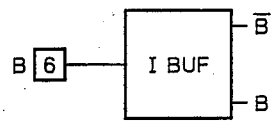
Figure 4:
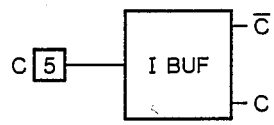
Figure 4:
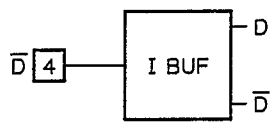
Figure 4:
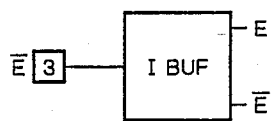
Figure 5:
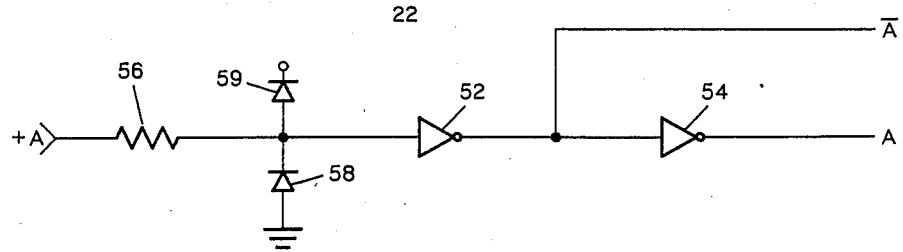
FIG. 5 is a schematic ciagram of the input buffer circuit of FIG. 4.
Figure 6:
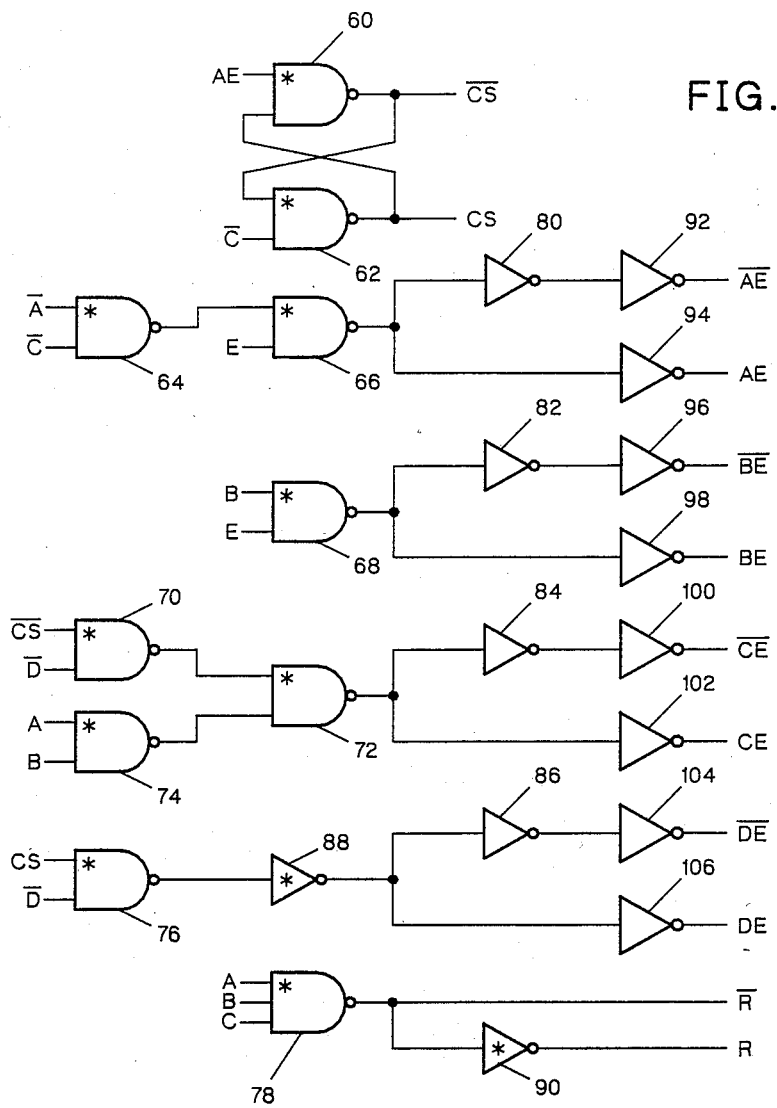
FIG. 6 is a schematic diagram of the clock control circuitry used to generate timing signals to control the testing of the chip.

Referring to FIG. 4, the input pads of the clock signals A, B, C, D and E are each connected to an input buffer 22 which provides protection and buffering for the input signals and complementary output signals. FIG. 5 shows the circuitry of one of the input buffers. Input protection is provided by resistor 56 and diodes 58 and 59. The complementary signals are provided by inverters 52 and 54. The figure shows the input buffer for the signal A. The two other signals that are true high, A and B, use identical circuitry. The input buffers for the two signals, D and E, that are true low, are identical except that the polarity of the output signals is reversed. FIG. 6 shows the clock decoding circuitry consists of NAND gates 60–78 and inverters 80–106. This circuitry decodes the complementary clock signals from the input buffers, A–E, and generates the signals AE, BE, CE, DE, R and their complements.

The following description uses an asterisk, *, to denote a logic signal that is true when its voltage level is low. For example, the signal R is true when high while the signal R* is true when low. The use of the asterisk is identical to the bar over a signal name on a circuit drawing. Since many signal names are a combination of individual signal names, for example, the signal AE is the result of the logical AND of the two signals A and E, parenthesis, ( ), are sometimes used with the asterisk to avoid ambiguity. Thus, (AE)* means the signal AE that is true when both A and E are low, while (A)*E would be the signal that is true when A is low and E is high.

Figure 7:
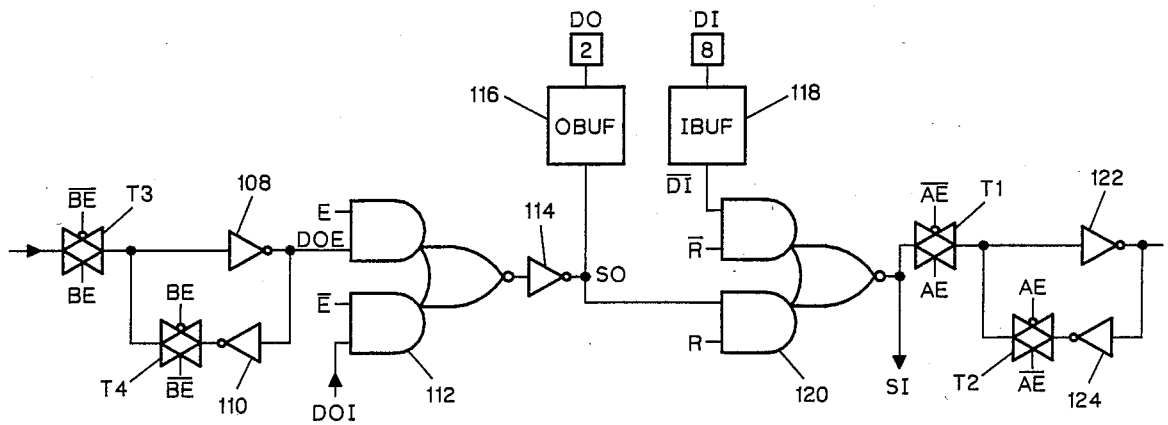
FIG. 7 is a schematic diagram of the output and input circuitry of the test portion of the chip.

Referring to FIG. 7, the Output Buffer 116 is driven by the inverter 114 and the AND-OR-INVERT gate 112. The gate 112 selects either DOI or DOE as inputs. DOI is the data-out signal from the internal shift register of the chip 10, fabricated as part of the internal circuitry 12. DOE is the data-out signal from the external shift register 20. The transmission gates T3 and T4 and the two inverters 108 and 110 are the slave latch of the last stage in the external shift register. In the present embodiment, this is the ring oscillator output. When E is true, DOE is selected for the Output Buffer; when E if false, DOI is selected. The output, SO (Shift Out), of the AND-OR-INVERT gate 112 is inverted by the inverter 114 and goes to the output buffer and to the input select circuitry. The AND-OR-INVERT gate 120 is used to select either (DI)* or SO. (DI)* is the data-in signal from the tester and SO is the data-out signal from the output select circuitry. The two transmission gates T1 and T2 and the inverters 122 and 124 are the master latch of the first stage of the external shift register. When the signal R is true, SO is selected as the input; and when R is false, (DI)* is selected. The three input NAND gate 78 and the inverter 90 shown in FIG. 6 are used to generate the signal R. R will be true whenever A, B and C are true.

Figure 8:
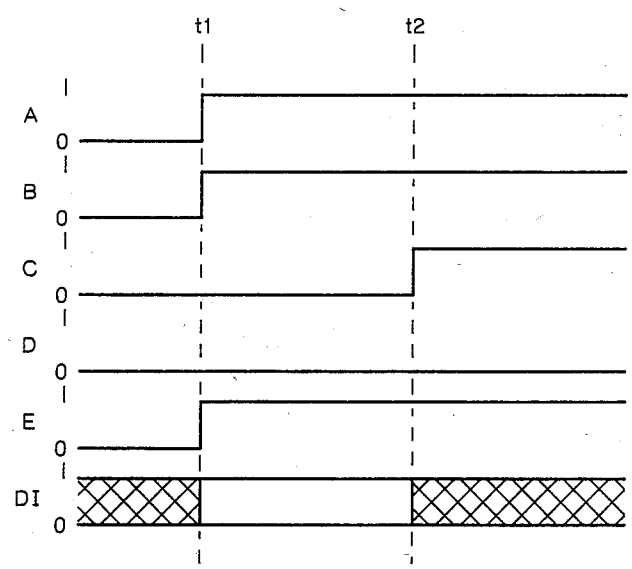
FIG. 8 is a timing diagram showing the various operations of the ring oscillator.

A timing diagram is shown in FIG. 8. At time t1, the tester raises the input signals A, B and E. The clock decoding circuitry of FIG. 6 decodes the signals A through E, and their complements, from the input buffers shown in FIG. 5, and generates three high level signals AE, BE and DE and a low level signal CE. These four signals turn on the transmission gates labeled T1, T3 and T5, shown in FIGS. 2 and 3, and turn off the transmission gates T2 and T4. This allows the signal at the output of the AND-OR-INVERT gate 120 (shown on FIG. 7) to pass through the ring oscillator. Since the signal C is low, the three input NAND gate 78 (FIG. 6) will cause R* to be high, causing (DI)* to be selected as the input to the ring oscillator.

The signal (DI)*, inverted by the AND-OR-INVERT gate 120, passes through the ring oscillator until it appears at the last stage as DOE. Since the signal E is high, the output circuitry, shown in FIG. 7, will pass DOE on to the tester as the signal SO. The tester, after detecting the arrival of SO, raises the signal C. This is shown at time t2 on FIG. 8. Prior to time t1 and after time t2, the data-input signal DI is shown cross-hatched, indicating the don't-care condition for the signal. When the signal C goes high, the three input NAND gate 78 on FIG. 6 will cause the signal R to go high and R* to go low. The AND-OR-INVERT gate will then select the signal SO instead of (DI)* as the input to the ring oscillator. The signals AE, BE, CE and DE are not affected when the signal C goes high so transmission gates T1, T3 and T5 remain turned on and T2 and T4 remain turned off. Since SO is the inversion of (DI)* (inverted by the AND-OR-InVERT gate 120) the ring oscillator will generate a square wave as the output signal SO is inverted before being applied to the input again. The period of the square wave is equal to two delay times through the ring oscillator and the input and output select circuitry. The tester senses each transition of the signal SO through the output circuitry shown in FIG. 7b and uses the time measured to determine the average circuit delay for all of the circuits involved in the ring oscillator. The ring oscillator will oscillate until the tester changes the timing signals, A, B, C and D.

The ring oscillator produces a square wave for the tester to use in its delay measurement. If a chip has 256-I/O pads, the ring oscillator and additional circuitry has more than 1250 individual circuit delays (two inverters and three transmission gates, each with one circuit delay, per shift register stage). Since, as discussed above, process variations in CMOS technology tend to affect all circuits on a chip equally, the ring oscillator will multiply the discrepancy in circuit delay by more than 1250, making it easier to measure. The rising and falling edges of square wave output of the ring oscillator will be degraded by the inductance of the probe, turning it into a trapezoidal waveform with ringing superimposed on it. However, the waveform is repetitious and it is only necessary to trigger a counter at a given level on the rising or falling edge of the waveform to determine the period of the waveform. Since each transit through the ring oscillator causes a inversion, the total delay through the circuits of the ring oscillator and additional circuitry is one-half the period.

The ring oscillator solves the problem of delay testing CMOS LSI and VLSI chips when they are part of the wafer. Since CMOS circuitry has the characteristic of little or no power consumption under DC conditions, the ring oscillator does not add to the heat dissipation of the chip when the chip is being used in its normal application.

The ring oscillator can also be used for delay testing at any package level, i.e., integrated circuit package level, printed circuit board level, or system level. CMOS circuitry is very sensitive to voltage and temperature changes, that is, a decrease in supply voltage or an increase in ambient temperature will cause the circuit delays of CMOS to increase. The ring oscillator can be used at the package level to detect a poor die bond, which would cause an increase in chip temperature, or at the printed circuit board level to detect a cold solder joint on a power pin, which would cause a low voltage to the chip. The ring oscillator can also be used at the system level to find hot-spots, caused by poor design or plugged filters, or to check for low voltage, caused by poor design, poor connections, low power supply voltage, etc. A record of the original delay measured on the chip can be maintained and changes in the newly measured valve can be used to isolate the problem.

What is claimed is:

1. A method of performing delay testing of CMOS LSI or VLSI integrated circuits comprising the steps of:
    (a) realizing a shift register circuit having a large number of serially connected stages as part of the LSI/VLSI CMOS circuitry;
    (b) realizing a shift register control circuit as part of the LSI/VLSI CMOS circuitry that controls the operation of said shift register circuit and allows the shift register circuit to operate in at least one of two modes, a first mode of which permits data signals to be controllably clocked through the shift register stages, and a second mode of which allows the shift register to operate as a ring oscillator and permits data signals to propagate through the shift register stages at a speed limited only by the inherent propagation delay times associated with each shift register stage;
    (c) including logic combinational circuitry as part of said LSI/VLSI circuitry that selectively allows said shift register circuit to be configured as a ring oscillator in response to control signals generated by said shift register control circuit;
    (d) placing input/output pads around the periphery of said LSI/VLSI CMOS circuitry through which data signals and control signals may be sent to or received from the shift register circuit, control circuit, and other circuitry forming part of said LSI/VLSI circuitry;
    (e) sending appropriate control signals to said shift register control circuit to cause said shift register circuit to assume its second mode of operation;
    (f) injecting a data signal into a first stage to said shift register circuit through one of said input/output pads; and
    (g) measuring the period of oscillation associated with said ring oscillator, said period of oscillation being related to the delay time it takes said data signal to propagate through the stages of said shift register circuit.

2. The method of claim 1 wherein the number of stages associated with said shift register circuit is greater than 200.

3. The method of claim 2 wherein the shift register stages are placed around the periphery of the CMOS LSI/VLSI circuitry near said input/output pads.

* * * * *